United States Patent
Kong et al.

(10) Patent No.: US 10,957,744 B2
(45) Date of Patent: Mar. 23, 2021

(54) DISPLAY DEVICE INCLUDING PROCESS KEY

(71) Applicant: LG Display Co., Ltd., Seoul (KR)

(72) Inventors: Young-Hyun Kong, Paju-si (KR);
Won-Jun Choi, Paju-si (KR);
Gyu-Bum Jang, Paju-si (KR);
Hye-Rim Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 125 days.

(21) Appl. No.: 16/151,174

(22) Filed: Oct. 3, 2018

(65) Prior Publication Data
US 2019/0131359 A1 May 2, 2019

(30) Foreign Application Priority Data
Oct. 31, 2017 (KR) .................. 10-2017-0143331

(51) Int. Cl.
*H01L 27/32* (2006.01)
*H01L 51/56* (2006.01)
(Continued)

(52) U.S. Cl.
CPC ........ *H01L 27/3223* (2013.01); *G02F 1/1368* (2013.01); *G02F 1/133512* (2013.01);
(Continued)

(58) Field of Classification Search
CPC ......... H01L 23/544; H01L 2223/54426; H01L 27/3223; H01L 2223/54486; G02F 2001/133354; G02F 1/133512
See application file for complete search history.

(56) References Cited

U.S. PATENT DOCUMENTS 6,674,495 B1 * 1/2004 Hong ................ G02F 1/136209
349/43
7,532,277 B2 5/2009 Kwon et al.
(Continued)

FOREIGN PATENT DOCUMENTS

JP 2005266284 A * 9/2005
KR 10-2005-0019988 A 3/2005
(Continued)

OTHER PUBLICATIONS

Korean Intellectual Property Office, Office Action, KR Patent Application No. 10-2017-0143331, dated Jan. 17, 2019, six pages (with concise explanation of relevance).

*Primary Examiner* — Marcos D. Pizarro
*Assistant Examiner* — Antonio B Crite
(74) *Attorney, Agent, or Firm* — Fenwick & West LLP

(57) ABSTRACT

The present disclosure relates to a display device including a process key, and more particularly, to a process key with an improved recognition rate in a display device implementing a narrow bezel. The feature of the present disclosure is such that a process key is divided into and formed as a first key pattern made of a metal material and a second key pattern made of a black matrix material, and the process key is positioned in a green pixel area in which a green color filter pattern is provided among pixels positioned at outermost peripheries corresponding to four corners of an active area of a display panel such that a narrow bezel can be implemented and a recognition rate of the process key can also be improved. Consequently, the display panel can be accurately aligned with manufacturing equipment or other objects such that a process defect can be minimized and process efficiency cab also be improved. Further, the process key can be recognized from both upper and lower sides of the display panel so that the process can be improved.

16 Claims, 9 Drawing Sheets

(51) Int. Cl.
*H01L 23/544* (2006.01)
*H01L 27/12* (2006.01)
*H01L 51/52* (2006.01)
*G02F 1/1335* (2006.01)
*G02F 1/1362* (2006.01)
*G02F 1/1368* (2006.01)
*G02F 1/1333* (2006.01)

(52) U.S. Cl.
CPC .. *G02F 1/133514* (2013.01); *G02F 1/136286* (2013.01); *H01L 23/544* (2013.01); *H01L 27/124* (2013.01); *H01L 27/322* (2013.01); *H01L 27/3272* (2013.01); *H01L 51/56* (2013.01); *G02F 2001/133354* (2013.01); *H01L 27/3276* (2013.01); *H01L 51/5284* (2013.01); *H01L 2223/54426* (2013.01); *H01L 2223/54486* (2013.01)

(56) References Cited

U.S. PATENT DOCUMENTS

| | | | |
|---|---|---|---|
| 7,601,470 B2 * | 10/2009 | Park | G02F 1/133516 430/7 |
| 7,629,613 B2 | 12/2009 | Sohn et al. | |
| 8,049,222 B2 | 11/2011 | Sohn et al. | |
| 2006/0049408 A1 | 3/2006 | Sohn et al. | |
| 2006/0290841 A1 * | 12/2006 | Kwon | G02F 1/1362 349/110 |
| 2010/0038650 A1 | 2/2010 | Sohn et al. | |

FOREIGN PATENT DOCUMENTS

| | | |
|---|---|---|
| KR | 10-2006-0023454 A | 3/2006 |
| KR | 10-1140241 B | 4/2012 |
| KR | 20150055643 A * | 5/2015 |

* cited by examiner

DISPLAY DEVICE INCLUDING PROCESS KEY

CROSS-REFERENCE TO RELATED APPLICATION

This application claims the benefit under 35 U.S.C. § 119(a) of Republic of Korea Patent Application No. 2017-0143331, filed on Oct. 31, 2017, in the Korean Intellectual Property Office, which is incorporated herein by reference in its entirety.

BACKGROUND

1. Technical Field

The present disclosure relates to a display device including a process key, and more particularly, to a process key with an improved recognition rate in a display device implementing a narrow bezel.

2. Discussion of the Related Art

Recently, as society has entered a full-fledged information age, display fields for processing and displaying mass information have rapidly advanced, and various display devices have been developed and have been getting attention in response to such advance.

Specific examples of the display devices include liquid crystal displays (LCDs) device, plasma display panel (PDP) devices, field emission display (FED) devices, electroluminescent display (ELD) devices, and organic light emitting diode (OLED) devices, and these display devices are excellent in performance of reducing thickness, weight, and power consumption to rapidly replace existing cathode ray tubes (CRTs).

Among these display devices, the LCD device includes an array substrate including a thin film transistor, a color filter substrate having a color filter and/or a black matrix, and a liquid crystal layer formed between the array substrate and the color filter substrate, thereby constituting a display panel. The alignment state of the liquid crystal layer is controlled according to an electric field applied between both electrodes of a pixel area so that light transmittance is controlled and thus an image is displayed.

Further, the OLED device includes a switching thin film transistor, a driving thin film transistor, first and second electrodes, a first substrate including an organic light emitting layer that is disposed between first and second electrodes, and a second substrate compressed and bonded to the first substrate, thereby constituting a display panel. A degree of light emission of an organic material is controlled according to a level of a voltage or an amount of a current applied between both electrodes of a pixel area, and thus an image is displayed.

When various processes (scribing, grinding, a module process, etc.) are performed on such display devices in states of the display panels, a process key for various purposes may be used for alignment with manufacturing equipment or other objects.

A process key is formed in a non-active area which is a bezel area of each of display panels and the process key may include a plurality of key patterns, each of which has a unique pattern or shape, so as to allow equipment of each process to recognize the plurality of key patterns. Although research has been actively conducted in recent years to reduce the bezel area of a display device, a process key positioned in the bezel area impose a limit on how narrow small the bezel area can become.

SUMMARY

Embodiments relate to providing a display device in which a bezel area is minimized.

Further, embodiments relate to allow a process key to be definitely detected at an upper side or a lower side of a display panel.

One or more embodiments relate to a display device including: a first substrate and a second substrate which face each other and in which an active area, in which an image is implemented, and a non-active area formed along an edge of the active area are defined; and a process key including a first key pattern provided on the first substrate to correspond to a corner in the active area, wherein the first key pattern is positioned on the first substrate.

Advantages and features of the disclosure will be set forth in part in the description, which follows and in part will become apparent to those having ordinary skill in the art upon examination of the following or may be learned from practice of the disclosure. Other advantages and features of the embodiments herein may be realized and attained by the structure particularly pointed out in the written description and claims hereof as well as the appended drawings.

It is to be understood that both the foregoing general description and the following detailed description are explanatory, and are intended to provide further explanation of the embodiments as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Hereinafter, embodiments of the present disclosure will be described in detail with reference to the accompanying drawings.

Figure 1A:
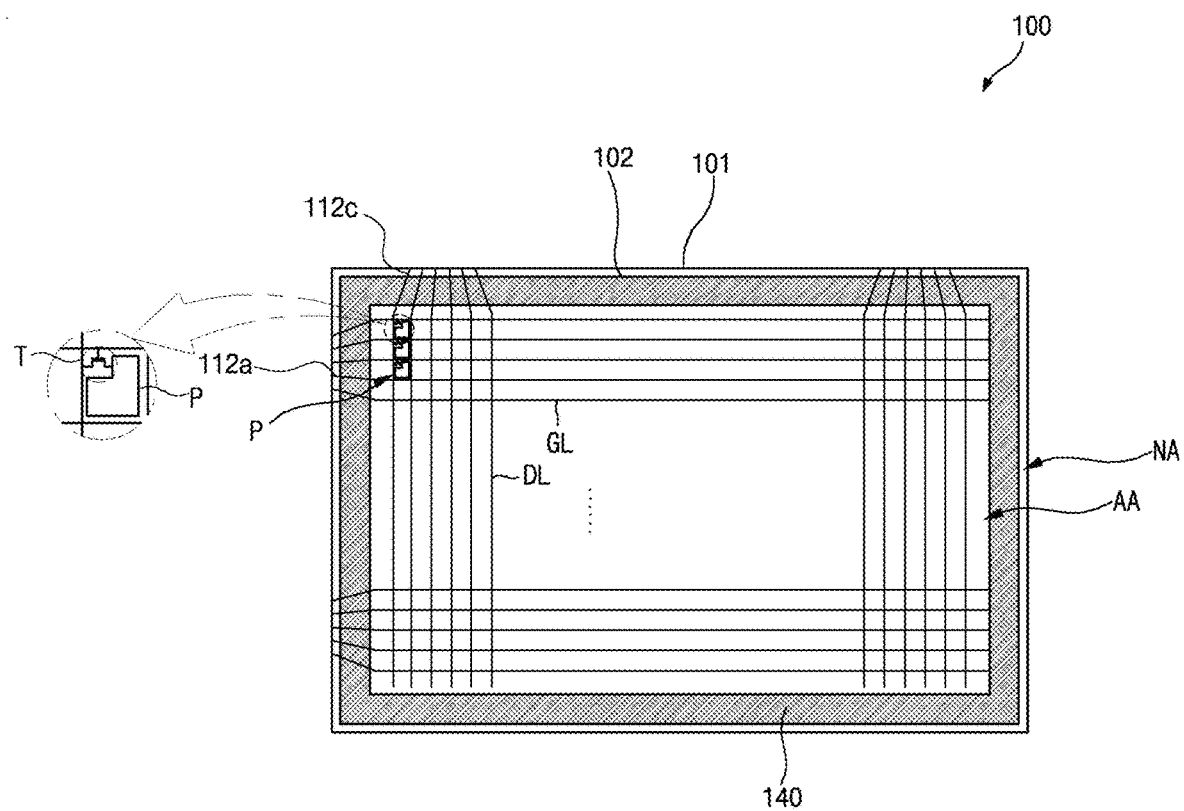
FIG. 1A is a schematic plan view illustrating a display panel according to an embodiment of the present disclosure.
Figure 1B:
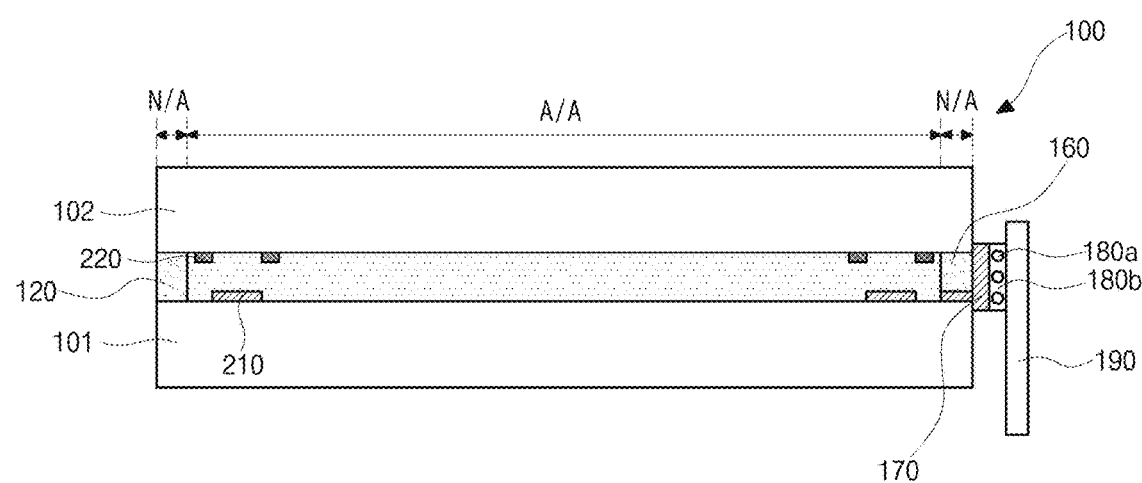
FIG. 1B is a cross-sectional view of FIG. 1A.

FIG. 1A is a plan view schematically illustrating a display panel according to an embodiment of the present disclosure, and FIG. 1B is a cross-sectional view of FIG. 1A. As shown in the drawings, a display panel 100 is made by bonding a first substrate 101 (e.g., a lower substrate) and a second substrate 102 (e.g., an upper substrate). When the display panel 100 is embodied as a liquid crystal display (LCD) device, a thin film transistor T (of FIG. 3) is provided on the first substrate 101, and a color filter pattern 133 (of FIG. 4) and/or a black matrix 131 (of FIG. 4) are provided on the second substrate 102, and a liquid crystal layer (of FIG. 4) is interposed between the first substrate 101 and the second substrate 102.

Further, when the display panel 100 is formed as an organic light emitting diode (OLED) device, a switching and drive thin film transistor, first and second electrodes 311 and 315 (of FIG. 8), an organic light emitting layer 313 (of FIG. 8) between the first and second electrodes 311 and 315 (of FIG. 8) are provided on the first substrate 101, and the second substrate 102 is spaced apart from the first substrate 101 by a protective layer 303 (of FIG. 8) having adhesiveness and is bonded to the first substrate 101 through the protective layer 303. Such a structure will be described in more detail below.

The thin film transistor T (of FIG. 3) and/or the first and second electrodes 311 and 315 (of FIG. 8) are positioned on the first substrate 101 of the display panel 100 so that a plurality of lines (not shown) are formed and a pad 160 is connected to a distal end of each of the plurality of lines (not shown). In this case, the plurality of lines (not shown) may be configured with signal lines such as gate and data lines 103 and 105 (of FIG. 3) and common bus lines 107 (of FIG. 3) or may be configured with non-signal lines such as antistatic lines (not shown).

In the display panel 100 according to the embodiment of the present disclosure, the first substrate 101 and the second substrate 102 are formed in the same shape, and thus one ends of the first substrate 101 and the second substrate 102 coincide with each other, and a side surface of the pad 160 provided at the distal end of each of the plurality of lines (not shown) is exposed to a side surface between the first substrate 101 and the second substrate 102.

A printed circuit board (PCB) 190 is connected to one side of the display panel 100 via a connecting member 170 such as a flexible PCB, and in this case, the connecting member 170 is attached and connected to a side surface of the display panel 100. That is, the connecting member 170 is electrically connected to the side surface of the pad 160, which is exposed to the side surface between the first substrate 101 and the second substrate 102, though an adhesive layer 180b including a conductive ball 180a. Although the connecting member 170 and the PCB 190 are illustrated as being connected to only one side of the display panel 100, the connecting member 170 and the PCB 190 may be additionally formed at the other side of the display panel 100.

Further, the pad 160 may be formed of the plurality of lines (not shown) as one body on the same layer, or the plurality of lines (not shown) may be formed of the data lines 105 (of FIG. 3) provided on a gate insulating layer 113 (of FIG. 4) and the pad 160 may be formed of a data pad provided below the gate insulating layer 113 (of FIG. 4), and in this case, the data pad is connected to the data lines 105 (of FIG. 3) through a contact hole (not shown) provided in the gate insulating layer 113 (of FIG. 4).

In such a display panel 100, the side surface of the pad 160 is exposed to a side surface of the first substrate 101, and the connecting member 170 is attached and connected to the side surfaces of the first and second substrates 101 and 102 such that a separate pad formation area (i.e., a pad area) is not required on the first and second substrates 101 and 102.

That is, when viewed from above, the entire area of the display panel 100 is formed to constitute an active area A/A in which an image is implemented, only excepting an edge area (i.e., a non-active area N/A) for an area in which an actual pattern 120 is formed. As the edge area (i.e., the non-active area N/A) is reduced, a display panel 100 with a narrower bezel can be achieved.

As described above, the display panel 100 with reduced the non-active area N/A has process keys 200 positioned in the active area A/A according to embodiments of the present disclosure. Particularly, the process key 200 is configured with a first key pattern 210 made of a metal material capable of reflecting light, and a second key pattern 220 made of a black pigment provided along an edge of the first key pattern 210, and the process key 200 is positioned in a green pixel area G-SP (of FIG. 3). Consequently, in the display panel 100 of the present disclosure, a recognition rate of the process key 200 is increased, and the process key 200 can be easily aligned with manufacturing equipment or other objects when performing various manufacturing processes, such as scribing, grinding, a module process, and the like, on the display panel 100. Particularly, the process key 200 is recognized at both upper and lower sides of the display panel 100 so that process efficiency can be further improved.

Figure 2:
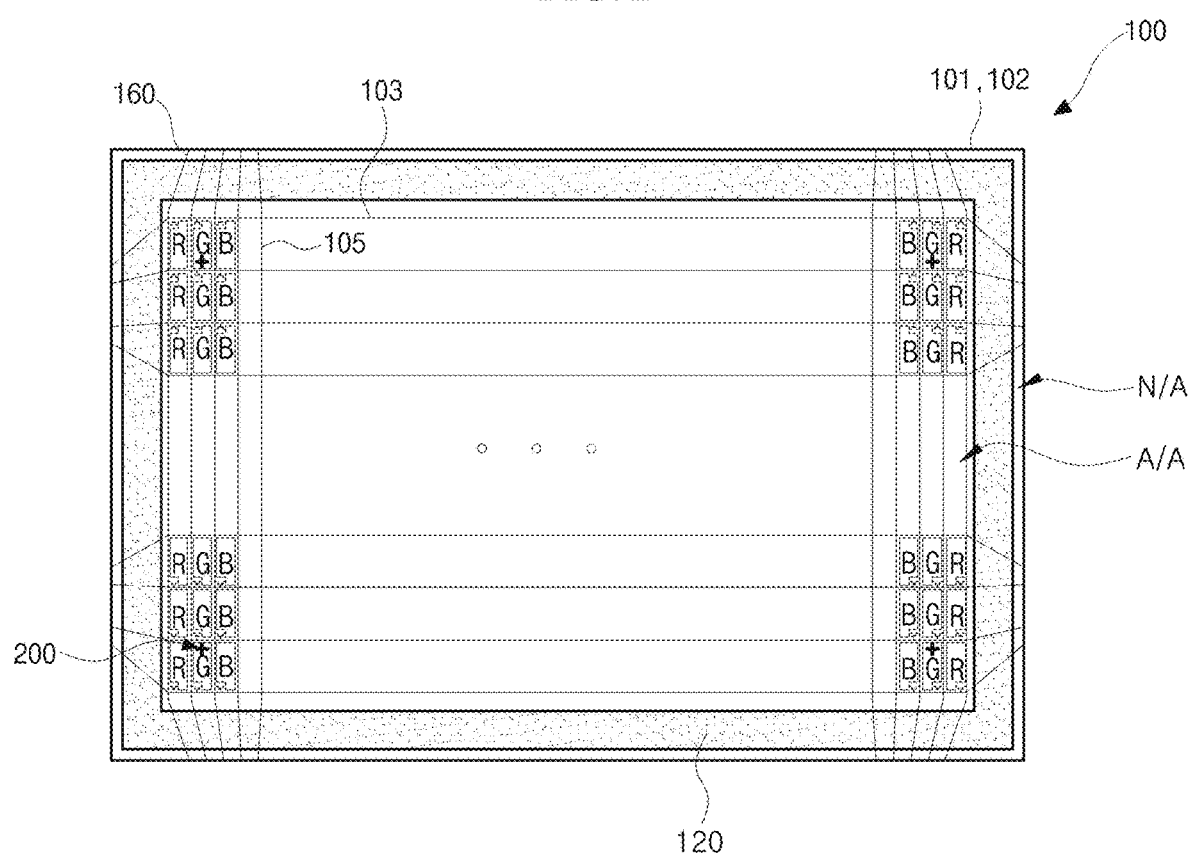
FIG. 2 is a plan view schematically illustrating a portion of a liquid crystal display (LCD) device according to a first embodiment of the present disclosure.
Figure 3:
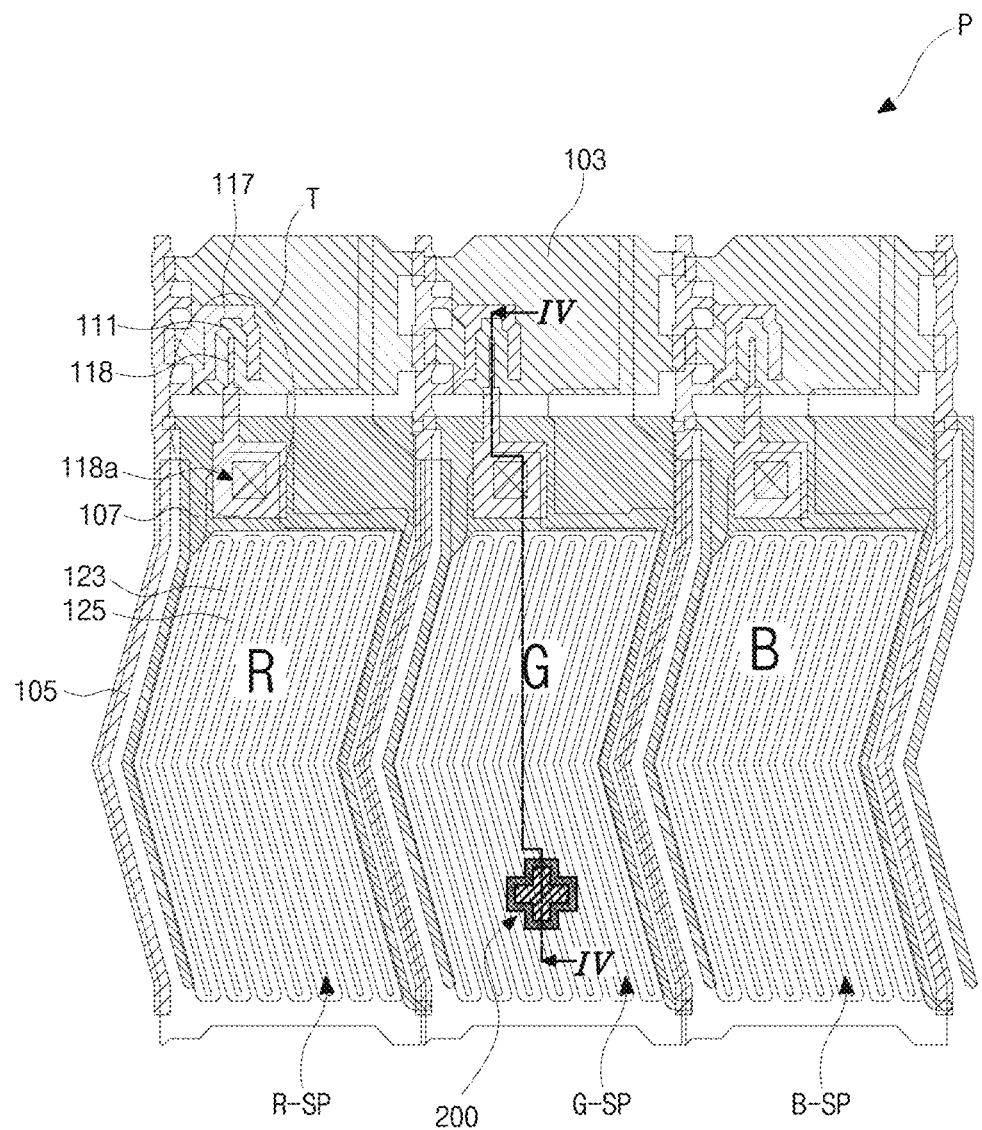
FIG. 3 is an enlarged plan view schematically illustrating a single pixel positioned at an outermost periphery of FIG. 2, according to the first embodiment.
Figure 4:
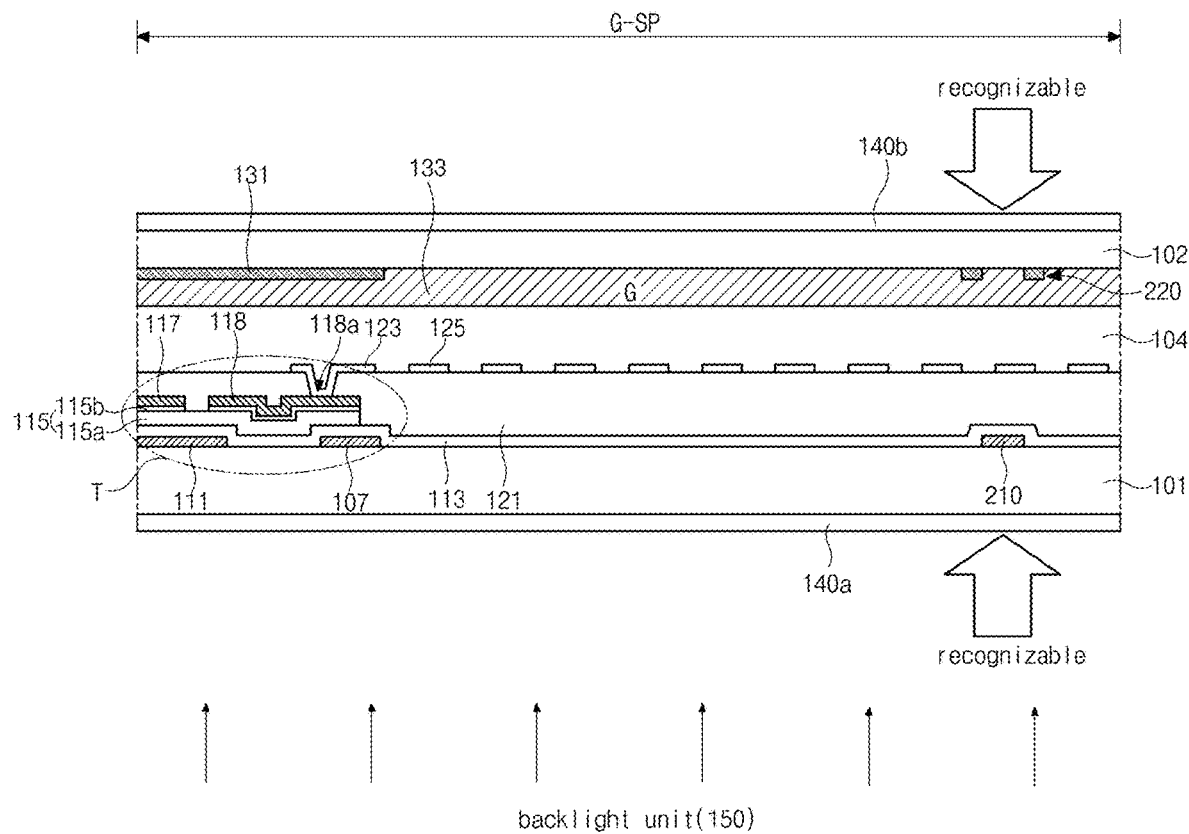
FIG. 4 is a cross-sectional view taken along the line IV-IV of FIG. 3, according to the first embodiment.

FIG. 2 is a plan view schematically illustrating a portion of an LCD device according to a first embodiment of the present disclosure, and FIG. 3 is an enlarged plan view schematically illustrating a single pixel positioned at an outermost periphery of FIG. 2. Further, FIG. 4 is a cross-sectional view taken along the line IV-IV of FIG. 3, FIGS. 5A to 6F are schematic diagrams illustrating process keys, and FIGS. 7A to 7C are diagrams illustrating experimental results of measuring recognition rates of the process keys according to a color of a color filter pattern. As shown in the drawings, the LCD device according to the first embodiment of the present disclosure includes a display panel 100, first and second polarizers 140a and 140b, and a backlight 150 for supplying light to the display panel 100.

In this embodiment, the display panel 100 is made by bonding faces of the first substrate 101 and the second substrate 102 with the liquid crystal layer 104 interposed therebetween. The first substrate 101, which is referred to as a lower substrate or an array substrate, and the second substrate 102, which is referred to as an upper substrate or a color filter substrate, are formed in the same shape so that one ends of the first substrate 101 and the second substrate 102 coincide with each other.

The display panel 100 includes an active area A/A, which displays an image, and a non-active area N/A, which is provided along an edge of the active area A/A and is not used to display an image, the non-active area N/A is defined along an edge of the display panel 100, and the active area A/A is positioned inside the non-active area N/A.

The actual pattern 120 is positioned in the non-active area N/A to prevent leakage of the liquid crystal layer 104 which fills in a space between the first substrate 101 and the second substrate 102. In the LCD device according to this embodiment, since the pad 160 is exposed to the side surface of the display panel 100, a separate pad formation area is not required on the first and second substrates 101 and 102. Therefore, the non-active area N/A is formed to correspond to a width of the actual pattern 120.

A plurality of pixel areas R-SP, G-SP, and B-SP are defined in the active area A/A of the display panel 100, and each of the pixel areas R-SP, G-SP, and B-SP is defined through the plurality of data lines 105 and a plurality of gate lines 103, which are provided at the first substrate 101, vertically and horizontally intersect with each other, and the thin film transistor T which is a switching element is provided at a crossing point between the two lines 103 and 105.

More specifically, on the first substrate 101, the plurality of gate lines 103 are formed in parallel to be spaced at predetermined intervals, the common bus lines 107 are formed adjacent and parallel to the gate lines 103, and the data lines 105 are formed to intersect with the gate lines 103 and the common bus lines 107, and particularly, with the gate lines 103, thereby defining the R (red), G (green), and B (blue) pixel areas R-SP, G-SP, and B-SP.

The thin film transistor T is formed in a switching area which is the crossing point of the gate line 103 and the data line 105 of each of the R, G and B pixel areas R-SP, G-SP and B-SP, and a common electrode 125 connected to the common bus line 107 and a pixel electrode 123 connected to the thin film transistor T are formed in the active area A/A in which an image is actually implemented.

The thin film transistor T includes a gate electrode 111, a gate insulating layer 113, a semiconductor layer 115 which includes an active layer 115a made of pure amorphous silicon, and an ohmic contact layer 115b made of amorphous silicon doped with impurities, and source and drain electrodes 117 and 118.

The pixel electrode 123 is electrically connected to the drain electrode 118 of the thin film transistor T. A plurality of bar-shaped pixel electrodes 123 and a plurality of bar-shaped common electrodes 125 are alternately positioned and spaced apart and are formed in the R, G and B pixel areas R-SP, G-SP and B-SP.

The gate electrode 111 may extend from the gate line 103, or the gate electrode 111 may be made of a portion of the gate line 103, and in this case, the gate electrode 111 may have a width that is wider than other portions of the gate line 103.

The protective layer 121 is formed on a front surface of the first substrate 101 including the thin film transistor T. In this case, a drain contact hole 118a for exposing the drain electrode 118 of the thin film transistor T is provided in the protective layer 121.

In an alternative embodiment, the pixel electrode 123 may be formed in a plate shape in each of the R, G and B pixel areas R-SP, G-SP and B-SP. In this case, a portion of the pixel electrode 123 may be formed to overlap the gate line 103 to constitute a storage capacitor.

Further, when a plurality of pixel electrodes 123 and a plurality of common electrodes 125 are formed to be spaced apart from each other in each of the R, G and B pixel areas R-SP, G-SP and B-SP, the display panel 100 operating in an in-plane switching (IPS) mode is formed, and only a plate-shaped pixel electrode 123 is formed at the first substrate 101 except the common electrode, the display panel 100, which operates in one mode among a twisted-nematic (TN) mode, an electrically controlled birefringence (ECB) mode, and a vertical alignment (VA) mode, is formed. An example of the display panel 100 operating in the IPS mode will be described with reference to the drawings.

Further, the black matrix 131 corresponding to the gate line 103, the data line 105, and the thin film transistor T of each of the R, G and B pixel areas R-SP, G-SP and B-SP, which are formed at the first substrate 101, is formed on the second substrate 102 facing the first substrate 101.

Accordingly, the black matrix 131 has an aperture corresponding to each of the R, G and B pixel areas R-SP, G-SP and B-SP, and a color filter layer including an R color filter pattern (not shown), the G color filter pattern 133, and a B color filter pattern (not shown) (corresponding to the apertures and are sequentially and repetitively disposed) is formed.

A pixel area with the R color filter pattern (not shown) is defined as the R pixel area R-SP, a pixel area with the G color filter pattern 133 is defined as the G pixel area G-SP, and a pixel area with the B color filter pattern (not shown) is defined as the B pixel area B-SP. These R, G and B pixel areas R-SP, G-SP and B-SP collectively form a single pixel P which exhibits various colors.

In this case, although not shown in the drawing, the color filter layer may be omitted, and a white pixel area having a transparent overcoat layer (not shown) may be further provided on an entire surface below the R color filter pattern (not shown), the G color filter pattern 133, and the B color filter pattern (not shown).

The LCD device according to the embodiment of the present disclosure has the process key 200 positioned in the active area A/A in which a plurality of pixel areas SP are provided. That is, the process keys 200 are positioned in at least four corners of the display panel 100, and in this case, the process key 200 is positioned in the G pixel area G-SP with the G color filter pattern 133, to correspond to the four corners of the active area A/A among a plurality of pixels P positioned at outermost peripheries along the edge of the active area A/A.

For example, when a single pixel P is configured with the R, G and B pixel areas R-SP, G-SP and B-SP, and the R, G, and B pixel areas R-SP, G-SP, and B-SP are sequentially positioned from the actual pattern 120 in the order thereof, the process key 200 is positioned in the G pixel area G-SP that is secondarily adjacent to the actual pattern 120, and when the R, G and B pixel areas R-SP, G-SP and B-SP are positioned from the process key 200 in the order of the R, B and G pixel areas R-SP, B-SP and G-SP, the process key 200 is positioned in the G pixel area G-SP that is thirdly adjacent to the actual pattern 120. That is, in an array structure of the various pixel areas R-SP, G-SP and B-SP in the single pixel P, the process key 200 is positioned to correspond to the G pixel area G-SP in the single pixel P positioned at the outermost periphery of the active area A/A.

When R, G1, B and G2 pixel areas constitute the single pixel P, the process key 200 may be positioned in the G1 pixel area and the G2 pixel area among the R, G2, B and G2 pixel areas, and in this case, the process key 200 may be positioned in a G pixel area positioned at the outermost periphery of the active area A/A among the G1 pixel area and the G2 pixel area.

The process key 200 includes the first key pattern 210 positioned on the first substrate 101, and the second key pattern 220 positioned on the second substrate 102 and corresponding to an edge of the first key pattern 210. The first key pattern 210 may be made of a material the same as those of the gate line 103 and the gate electrode 111 on the same layer and may reflect light. Further, the second key pattern 220 and the black matrix 131 are formed of the same material on the same layer.

As described above, the process key 200 is formed of the first and second key patterns 210 and 220, and particularly, the first key pattern 210 is formed of a metal material capable of reflecting light, and the second key pattern 220 and the black matrix 131 are formed of the same material so that it is possible to generate a large contrast difference between the first key pattern 210 and the second key pattern 220. In this way, the recognition rate of the process key 200 is increased by a larger contrast difference between the first key pattern 210 and the second key pattern 220.

The first key pattern 210 is formed of a material the same as those of the gate line 103 and the gate electrode 111 on the same layer, and the second key pattern 220 and the black matrix 131 are formed of the same material on the same layer so that a separate process of forming the first and second key patterns 210 and 220 of the process key 200 is not additionally required.

Although a shape of the first key pattern 210 has been shown as a cross shape, the first key pattern 210 may be formed of various shapes such as "–," "L," "O," and "T" shapes in addition to the cross shape, and alternatively, the first key pattern 210 may be formed in a shape including at least one among such various shapes.

The second key pattern 220 may have a shape the same as that of the first key pattern 210 along an edge thereof, and alternatively, the second key pattern 220 may be formed of a closed curve shape or a closed polygonal shape which surrounds the first key pattern 210. Further, the second key pattern 220 is formed in the outermost black matrix 131 on the second substrate 102, and the black matrix 131 may be formed to correspond to the shape of the first key pattern 210 by being opened or perforated.

The process key 200 may be formed by performing a sealing process (a bonding process) after positions of the first and second substrates 101 and 102 are aligned so as to dispose the first key pattern 210 on the first substrate 101 at a center of the second key pattern 220 which is perforated by compression bonding equipment using a camera such as a charge-coupled device (CCD) camera or the like.

Alternatively, the second key pattern 220 may be integrated with the first key pattern 210 to have a single shape, and when the first key pattern 210 is formed in a half-circle shape, the second key pattern 220 is also formed of a half-circle corresponding to the first key pattern 210 so that the first key pattern 210 and the second key pattern 220 form a single circle.

Figure 5A:
FIGS. 5A to 6F are schematic diagrams illustrating process keys, according to the first embodiment.
Figure 5B:
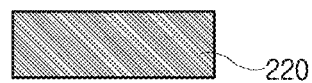
Figure 5C:
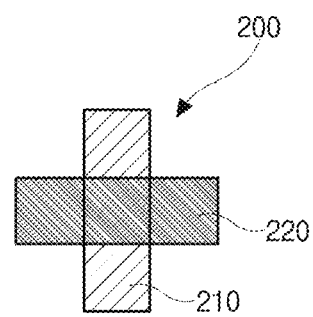

Alternatively, as shown in FIG. 5A, when the first key pattern 210 is formed of a line shape in a first direction, the second key pattern 220 is formed of a line shape perpendicular to the first direction as shown in FIG. 5B such that, as shown in FIG. 5C, the first key pattern 210 and the second key pattern 220 may overlap each other to form a cross shape.

Figure 6A:
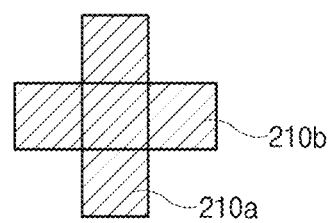
Figure 6B:
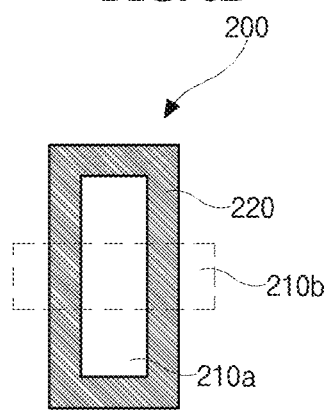
Figure 6C:
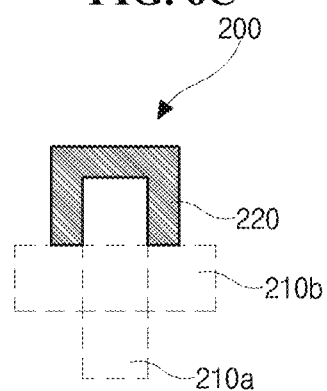
Figure 7A:
FIGS. 7A to 7C are diagrams illustrating experimental results of measuring recognition rates of the process keys according to a color of a color filter pattern.
Figure 7B:
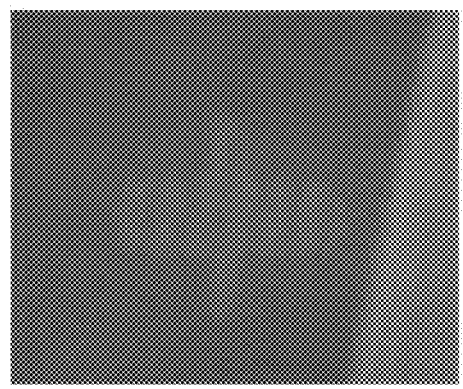
Figure 7C:
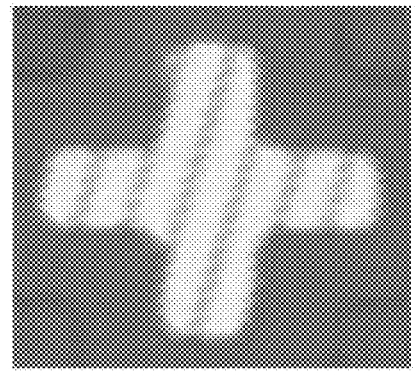

In yet another modification, as shown in FIG. 6A, when the first key pattern 210 is configured with a first direction pattern 210a made of a line shape in a first direction and a second direction pattern 210b made of a line shape in a second direction perpendicular to the first direction, the second key pattern 220 may be formed in a shape the same as that of the first direction pattern 210a along only an edge of the first direction pattern 210a as shown in FIG. 6B, or the second key pattern 220 may be formed along only a portion of the edge of the first direction pattern 210a as shown in FIG. 6C.

Figure 6D:
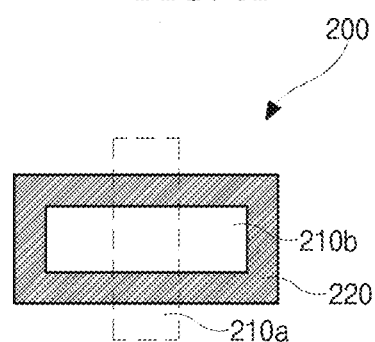
Figure 6E:
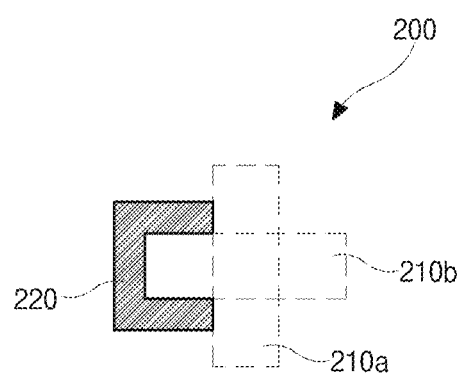

Alternatively, as shown in FIG. 6D, the second key pattern 220 may be formed in a shape the same as that of the second direction pattern 210b of the first key pattern 210 along an edge of the second direction pattern 210b, or as shown in FIG. 6E, the second key pattern 220 may be formed along only a portion of the edge of the second direction pattern 210b.

Figure 6F:
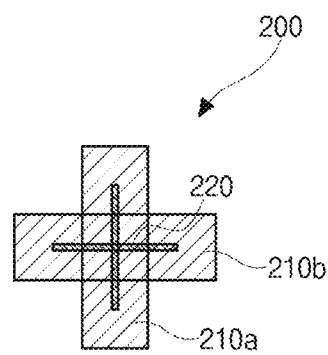

As yet another modification, as shown in FIG. 6F, the second key pattern 220 may be formed to overlap an interior of the first key pattern 210 by having a width that is smaller than those of the first and second direction patterns 210a and 210b.

The second key pattern 220 is shown to have a shape the same as that of the first key pattern 210, but the second key pattern 220 and the first key pattern 210 may be formed of different shapes. Particularly, in the display panel 100 of the present disclosure, the process key 200 is located in the G pixel area G-SP including the G color filter pattern 133 among the R, G and B pixel areas R-SP, G-SP and B-SP so that, even when the process key 200 is located in the active area A/A, the process key 200 may be better detected.

Particularly, the process key 200 is detected at both the upper and lower sides of the display panel 100 so that process efficiency may be improved. To describe in more detail, the process key 200 positioned in the display panel 100 is recognized by detecting light reflected from the process key 200 after light is irradiated to the process key 200.

The LCD device according to the first embodiment of the present disclosure, the first key pattern 210 is formed of a material the same as those of the gate line 103 and the gate electrode 111 on the same layer on the first substrate 101, and the second key pattern 220 and the black matrix 131 are formed of the same material on the same layer on the second substrate 102, and thus, when light passes through only the transparent first substrate 101, the first key pattern 210 made of a metal material may be detected from a lower side of the display panel 100 so that the first key pattern 210 may be recognized more definitely.

On the other hand, when the process key 200 is detected at an upper side of the display panel 100, light irradiated from the upper side is absorbed and blocked by the R color filter pattern (not shown), the G color filter pattern 133, and the B color filter pattern (not shown), such that the first key pattern 210 provided on the first substrate 101 is not detected and only the second key pattern 220 provided on the second substrate 102 is detected.

Since the second key pattern 220 and the black matrix 131 are made of the same material, a portion of the light is absorbed by the second key pattern 220 without being reflected, such that the second key pattern 220 is also not definitely recognized.

As shown in Table 1 below, it can be seen that REF., in which a color filter pattern is not provided, has 100% transmittance, while transmittance of each of the R, G and B pixel areas R-SP, G-SP and B-SP having the R color filter pattern (not shown), the G color filter pattern 133, and the B color filter pattern (not shown), respectively, is lower than that of REF., in which the color filter pattern is not provided.

TABLE 1

|  | REF. | First pixel area (R color filter pattern) | G pixel area G-SP (G color filter pattern) | Third pixel area (B color filter pattern) |
| --- | --- | --- | --- | --- |
| Transmittance (%) | 100 | 17.20 | 62.40 | 1.70 |

Meanwhile, referring to Table 1, it can be seen that a difference in transmittance occurs according to a difference in color of the color filter patterns, and the G pixel area G-SP having the G color filter pattern 133 has transmittance of 50% or more among the R, G and B pixel areas R-SP, G-SP and B-SP, and thus it can be seen that the transmittance of the G pixel area G-SP is much higher than those of the R and B pixel areas R-SP and B-SP having the R and B color filter patterns (not shown).

Consequently, the process key 200 is positioned in the G pixel area G-SP in which the G color filter pattern 133 is positioned so that the process key 200 may be detected even from the upper side of the display panel 100.

Referring to FIGS. 7A to 7C, it can be confirmed that the process key 200 is recognizable in the B pixel area G-SP in which the G color filter pattern 133 is provided, as shown in FIG. 7C, when compared with the R pixel area R-SP in which the R color filter pattern (not shown) is located, as shown in FIG. 7A, and the B pixel area B-B in which the B color filter pattern (not shown) is provided, as shown in FIG. 7B.

Particularly, in the process key 200 according to the first embodiment of the present disclosure, the first key pattern 210 is made of a metal material, and the second key pattern 220 is made of a black matrix material to surround the first key pattern 210, and thus a difference in contrast between the key pattern 210 and the second key pattern 220 may be formed to be larger, such that the process key 200 can be better recognized.

That is, in the process key 200 according to the first embodiment of the present disclosure, the difference in contrast between the first key pattern 210 and the second key pattern 220 is formed to be larger, and thus the process key 200 can be primarily recognized more definitely, and also the process key 200 is positioned in the G pixel area G-SP in which the G color filter pattern 133 having transmittance higher than those of the R and B color filter patterns (not shown) is positioned, such that the process key 200 can be secondarily recognized more definitely.

Particularly, as described above, as the recognition rate of the process key 200 is improved, the process key 200 may be definitely recognized from both the upper and lower sides of the display panel 100 so that process efficiency of the display panel 100 can also be improved. That is, as described above, the process key 200 is recognizable from both the upper and lower sides of the display panel 100 so that when the display panel 100 is aligned with manufacturing equipment or other objects through the process key 200 to perform various manufacturing processes on the display panel 100, the process key 200 may be detected from the upper and lower sides of the display panel 100 as necessary so that the process efficiency can be improved.

Meanwhile, although the process key 200 is positioned in the active area A/A where an image is displayed, a size of the process key 200 is very small as compared with that of the display panel 100 and is positioned to correspond to only the four corners of the display panel 100 so that the process key 200 is difficult to be visually recognized by a viewer and there is no influence in displaying an image on the display panel 100. As described above, in the LCD device according to the first embodiment of the present disclosure, the process key 200 includes the first key pattern 210 made of a metal material and the second key pattern 220 made of a black matrix material. The process key 200 is positioned in the G pixel area G-SP having the G color filter pattern 133 among the pixels P positioned at the outermost peripheries corresponding to the four corners of the active area A/A so that a narrow bezel can be implemented and the recognition rate of the process key 200 can also be improved.

Consequently, the display panel 100 may be accurately aligned with manufacturing equipment or other objects, reducing process defects and increasing efficiency. Further, the process key 200 is detected at both the upper and lower sides of the display panel 100 so that the process efficiency can be improved.

Although not shown in the drawing, in the LCD device, a dummy pixel area (not shown) in which an image is not implemented may further be positioned in the active area A/A, and the dummy pixel area (not shown) may be positioned to surround edges of the R, G and B pixel areas R-SP, G-SP and B-SP where the image is displayed in the active area A/A, may be positioned at upper and lower ends and/or left and right sides in the active area A/A, or may be positioned to correspond to one corner of the active area A/A.

The process key 200 according to the first embodiment of the present disclosure may be positioned in the dummy pixel area (not shown), and when the dummy pixel area (not shown) includes R, G and B color filter patterns (not shown), the process key 200 may also be positioned in a G dummy pixel area (not shown) in which the G color filter pattern (not shown) is positioned.

The dummy pixel area (not shown) is not occluded by an actual pattern (not shown) or a black matrix (not shown) so that while various processes are performed, the display panel 100 may be accurately aligned with manufacturing equipment or other objects through the process key 200 positioned in the dummy pixel area (not shown). Alternatively, the G color filter pattern 133 may be positioned above the thin film transistor T on the first substrate 101, and at this point, the black matrix 131 may also be positioned on the second substrate 102, or both the G color filter pattern 133 and the black matrix 131 may also be positioned on the first substrate 101 in which the thin film transistor T is provided, and even in this case, the first key pattern 210 of the process key 200 may be formed of a material the same as that of an electrode or a line constituting the thin film transistor T, and the second key pattern 220 of the process key 200 and the black matrix 131 may be formed of the same material.

Figure 8:
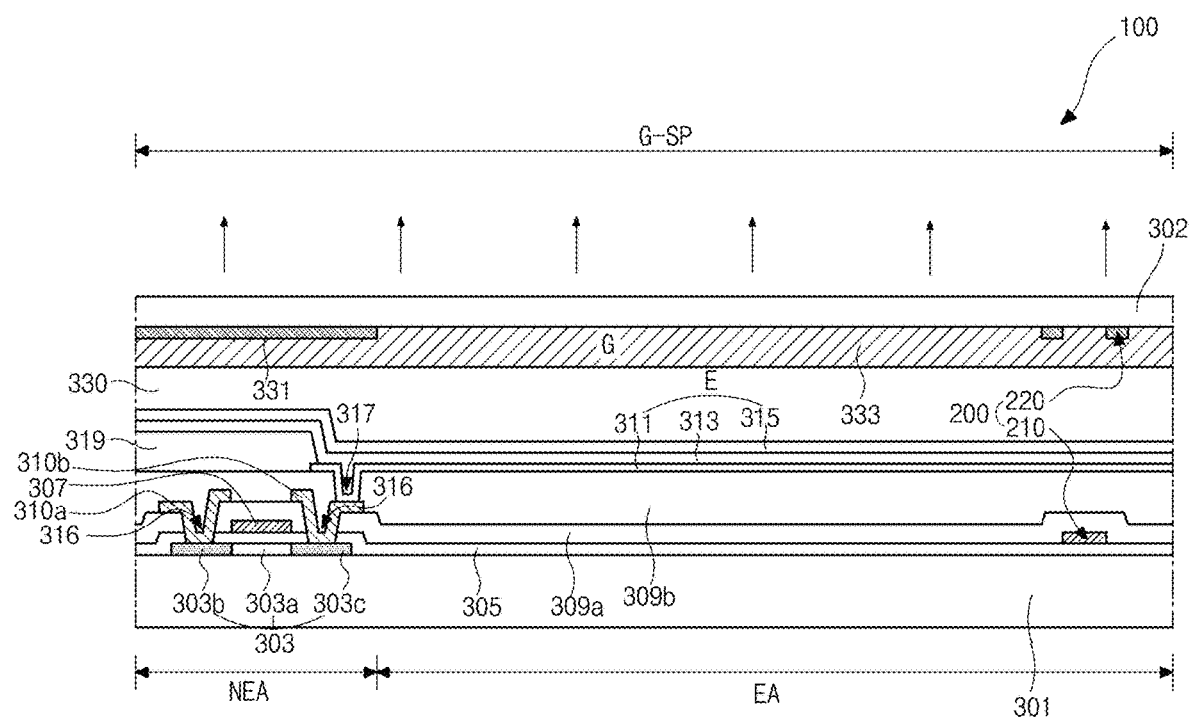
FIG. 8 is a cross-sectional view schematically illustrating an organic light emitting diode (OLED) device according to a second embodiment of the present disclosure.
Figure 9:
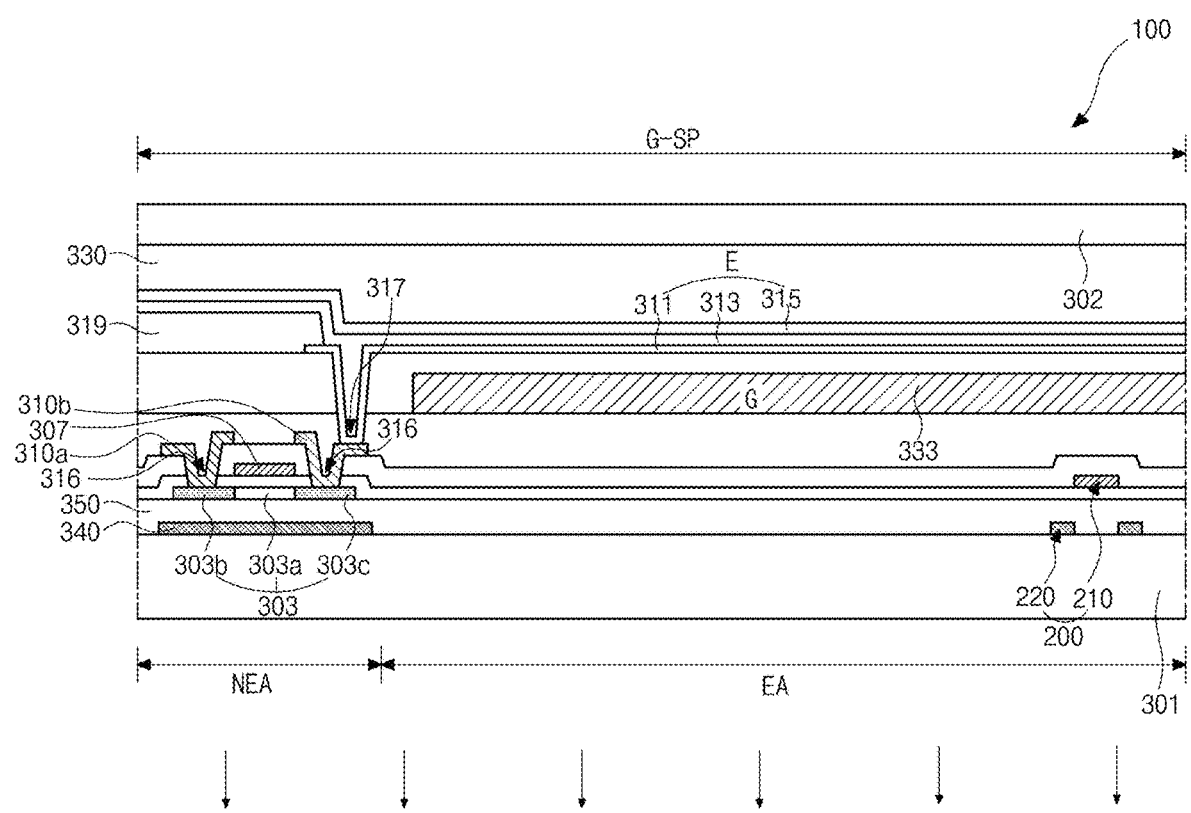
FIG. 9 is a cross-sectional view schematically illustrating another OLED device according to the second embodiment of the present disclosure.

FIG. 8 is a schematic cross-sectional view illustrating an OLED device according to a second embodiment of the present disclosure. FIG. 8 illustrates a G pixel area G-SP in which a G color filter pattern is provided to correspond to four corners of an active area among a plurality of pixels positioned at outermost peripheries along an edge of the active area. Further, FIG. 9 is a cross-sectional view schematically illustrating another OLED device, according to the second embodiment of the present disclosure.

Generally, OLED devices are classified into a top emission type OLED device and a bottom emission type OLED device, depending on a transmission direction of emitted light. Hereinafter, an example of a top emission type OLED device according to the present disclosure is described.

For convenience of description, an area in which a drive thin film transistor DTr is formed is defined as a non-emission area NEA, and an area in which a light emitting diode E is formed is defined as an emission area EA.

As shown in the drawings, in a display panel 100 of the OLED device according to the second embodiment of the present disclosure, a first substrate 301 on which the drive thin film transistor and the light emitting diode E are formed is encapsulated by an encapsulated substrate 302.

More specifically, a semiconductor layer 303 is positioned in the non-emission area NEA of a G pixel area G-SP on the first substrate 301. The semiconductor layer 303 is formed of silicon and includes an active region 303a constituting a channel at a central portion of the semiconductor layer 303 and includes source and drain regions 303b and 303c doped with a high concentration of impurities and provided at both lateral surfaces of the active region 303a.

A gate insulating layer 305 is positioned above the semiconductor layer 303.

A gate electrode 307 corresponding to the active region 303a of the semiconductor layer 303 and a gate line (not shown) extending in one direction are provided on the gate insulating layer 305.

Further, a first interlayer insulating layer 309a is positioned above the gate electrode 307 and the gate line (not shown). First and second semiconductor layer contact holes 316 in the first interlayer insulating layer 309a expose the source and drain regions 303b and 303c that are positioned at both lateral surfaces of the active region 303a. The gate insulating layer 305 is provided below the first interlayer insulating layer 309a.

Source and drain electrodes 310a and 310b are spaced apart from each other and are in contact with the source and drain regions 303b and 303c exposed through the first and second semiconductor layer contact holes 316. The source and drain electrodes 310a and 310b are provided on the first interlayer insulating layer 309a including first and second semiconductor layer contact holes 316. Further, a second interlayer insulating layer 309b is positioned above the source and drain electrodes 310a and 310b and the first interlayer insulating layer 309a exposed between the source and drain electrodes 310a and 310b.

The semiconductor layer 303 includes the source and drain regions 303b and 303c in contact with the source and drain electrodes 310a and 310b. The gate insulating layer 305 and the gate electrode 307 are positioned above the semiconductor layer 303. The source and drain electrodes 310a and 310b, the semiconductor layer 303, the insulating layer 306 and the gate electrode 307 collectively form the drive thin film transistor DTr.

Although not shown in the drawing, a data line (not shown) is provided to define the G pixel area G-SP by intersecting with the gate line (not shown). A switching thin film transistor (not shown) has a structure the same as that of the drive thin film transistor DTr and is connected to the drive thin film transistor DTr.

Further, as shown in the drawing, the switching thin film transistor (not shown) and the drive thin film transistor DTr are an example of a top gate type in which the semiconductor layer 303 is formed of a polysilicon semiconductor layer or an oxide semiconductor layer. As a modified example, the switching thin film transistor (not shown) and the drive thin film transistor DTr may be provided in a bottom gate type made of pure amorphous silicon or amorphous silicon doped with impurities.

Furthermore, the first and second interlayer insulating layers 309a and 309b include a drain contact hole 317 exposing the drain electrode 310b. A first electrode 311 connected to the drain electrode 310b of the drive thin film transistor DTr and is made of, for example, a material having a relatively high work function value to constitute an anode of the light emitting diode E, is positioned above the second interlayer insulating layer 309b.

The first electrode 311 may be formed of a metal oxide such as indium tin oxide (ITO) or indium zinc oxide (IZO), a mixture of a metal and oxide such as ZnO:Al or SnO2:Sb, or a conductive polymer such as poly(3-methylthiophene), poly[3,4-(ethylene-1,2-dioxy)thiophene](PEDT), polypyrrole, or polyaniline. Further, the first electrode 311 may be formed of a carbon nanotube (CNT), a graphene, a silver nano wire, or the like.

The first electrode 311 is positioned on only the G pixel area G-SP, and a bank 319 is positioned between the first electrodes 311 positioned in adjacent pixel regions. That is, the first electrode 311 has a structure in which pixel areas are divided using the bank 319 as a boundary for each pixel area.

Further, an organic light emitting layer 313 is positioned above the first electrode 311, and the organic light emitting layer 313 may be formed of a single layer made of a light emitting material, and alternatively, in order to increase light emitting efficiency, the organic light emitting layer 313 may be formed as a multilayer including a hole injection layer, a hole transport layer, an emitting material layer, an electron transport layer, and an electron injection layer.

Furthermore, a second electrode 315 constituting a cathode is formed on the entire organic light emitting layer 313.

The second electrode 315 may be made of a material having a relatively low work function value. The second electrode 315 may have a dual-layered structure and may be configured as a single layer or a multilayer which is made of an alloy in which a first metal such as Ag or the like which is a metal material having a low work function, and a second metal such as Mg or the like are mixed with a predetermined ratio.

In the display panel 100 of the OLED device, when a predetermined voltage is applied to the first electrode 311 and the second electrode 315 according to a selected signal, holes injected from the first electrode 311 and electrons provided from the second electrode 315 are transported to the organic light emitting layer 313 to form excitons, and when the excitons transit from an excited state to a ground state, light is generated and emitted in the form of visible light. The emitted light passes through the second electrode 315 and exits to the outside so that the display panel 100 of the OLED device displays an image.

Further, a protective layer 330 in the form of a thin film type film is positioned above the drive thin film transistor DTr and the light emitting diode E, and the encapsulated substrate 302 having the color filter pattern 333 is provided on the protective layer 330 so that the OLED device is encapsulated. That is, a black matrix 331 is formed on the encapsulated substrate 302 facing the substrate 301 to correspond to the gate line (not shown) and the data line (not shown) of the G pixel area G-SP, which are formed on the first substrate 301, and the drive thin film transistor DTr.

Accordingly, the black matrix 331 has an aperture corresponding to the G pixel area G-SP, and a color filter layer including B color filter patterns 333, which correspond to the apertures and are sequentially and repetitively disposed, is formed.

The process key 200 is positioned at one side of the G pixel area G-SP. The process key 200 is divided into a first key pattern 210 positioned on the first substrate 301 and a second key pattern 220 positioned on the encapsulated substrate 302 and corresponding to an edge of the first key pattern 210.

The first key pattern 210 may be made of a material the same as those of the gate line (not shown) and the gate electrode 307 on the same layer to reflect light, and the second key pattern 220 and the black matrix 331 may be formed of the same material on the same layer.

As described above, the process key 200 is divided into the first and second key patterns 210 and 220, and particularly, the first key pattern 210 is formed of a metal material capable of reflecting light, and the second key pattern 220 and the black matrix 331 are formed of the same material so that it is possible to generate a large contrast difference between the first key pattern 210 and the second key pattern 220 so that a recognition rate of the process key 200 is increased by the contrast difference between the first key pattern 210 and the second key pattern 220.

The first key pattern 210 is formed of a material the same as those of the gate line (not shown) and the gate electrode 307 on the same layer, and the second key pattern 220 and the black matrix 331 are formed of the same material on the same layer so that a separate process of forming the first and second key patterns 210 and 220 of the process key 200 is not additionally required.

Although the shape of the first key pattern 210 has been shown as a cross shape, the first key pattern 210 may be formed in various shapes such as "–," "L," "O," "T," and the like, and the second key pattern 220 may be formed in a shape the same as that of the first key pattern 210 along an edge thereof, or the second key pattern 220 may be formed in a closed curve shape or a closed polygonal shape surrounding the first key pattern 210.

Alternatively, the second key pattern 220 may be integrated with the first key pattern 210 to have a single shape, the second key pattern 220 may be formed in a shape the same as that of the first key pattern 210 along an edge of a portion of the first key pattern 210, and the second key pattern 220 may be formed to overlap an interior of the first key pattern 210.

In yet another modification, the second key pattern 220 is formed in the outermost black matrix 331 on the encapsulated substrate 302, and the black matrix 331 may be formed to correspond to the shape of the first key pattern 210 by being opened or perforated.

Particularly, in the display panel 100 of the OLED device according to the present disclosure, the process key 200 is positioned in the G pixel area G-SP including the G color filter pattern 333 so that even when the process key 200 is located in the active area A/A of FIG. 2, the process key 200 can be detected more definitely.

Particularly, the process key 200 is detected at both the upper and lower sides of the display panel 100 so that process efficiency can be improved. That is, in the process key 200 according to the second embodiment of the present disclosure, the difference in contrast between the first key pattern 210 and the second key pattern 220 is enhanced, and thus, the process key 200 can be better recognized. Also, the process key 200 is positioned in the G pixel area G-SP in which the G color filter pattern 333 having transmittance higher than those of the R and B color filter patterns (not shown) is positioned, such that the process key 200 can further enhance the recognition. Particularly, as described above, as the recognition rate of the process key 200 is improved, the process key 200 may be definitely recognized from both the upper and lower sides of the display panel 100 so that process efficiency of the display panel 100 can also be improved.

Although the process key 200 is positioned in the active area A/A of FIG. 2 where an image is displayed, the size of the process key 200 is very small compared to that of the display panel 100 and is positioned to correspond to only the four corners of the display panel 100 so that the process key 200 is difficult to be visually recognized by a viewer and there is no or reduced effect in displaying an image on the display panel 100.

Referring to FIG. 9, in an OLED device of a bottom emission type in which the G color filter pattern 333 is provided on the second interlayer insulating layer 309b on the drive thin film transistor DTr, when the semiconductor layer 303 is formed as an oxide semiconductor layer, a light blocking layer 340 made of a black pigment may be further positioned below the semiconductor layer 303, and a buffer layer 350 may be positioned between the light blocking layer 340 and the semiconductor layer 303.

The first key pattern 210 of the process key 200 may be made of a material the same as that of the gate line (not shown) and the gate electrode 307 of the drive thin film transistor DTr on the same layer, and the second key pattern 220 may be formed of a material the same as that of the light blocking layer 340 positioned below the semiconductor layer 303 of the drive thin film transistor DTr.

As described above, in the display panel 100 of the OLED device according to the second embodiment of the present disclosure, the process key 200 is divided into the first key pattern 210 made of a metal material and the second key pattern 220 made of a material of the black matrix 331, and the process key 200 is positioned in the G pixel area G-SP in which the G color filter pattern 333 is provided among the pixels P of FIG. 3 positioned at the outermost peripheries corresponding to the four corners of the active area A/A of FIG. 2 of the display panel 100 so that a narrow bezel may be implemented and a recognition rate of the process key 200 can also be improved.

Consequently, the display panel 100 can be accurately aligned with manufacturing equipment or other objects, such that a process defect can be minimized and process efficiency can also be improved. Further, the process key 200 is detected at both the upper and lower sides of the display panel 100 so that the process efficiency can be improved.

Although not shown in the drawing, the display panel 100 of the OLED device may emit R, G, or B color from the light emitting diode E positioned in each pixel area, and at this point, the color filter pattern 333 may be omitted.

The black matrix 331 may be positioned inside or outside the encapsulated substrate 302, and the second key pattern 220 may be positioned inside or outside the encapsulated substrate 302 to correspond to a position of the black matrix 331.

Further, both the color filter pattern 333 and the black matrix 331 may be positioned outside the encapsulated substrate 302, and at this point, the second key pattern 220 is also positioned outside the encapsulated substrate 302.

As described above, according to the present disclosure, a process key is divided into a first key pattern made of a metal material and a second key pattern made of a black matrix material. The process key is positioned in a G pixel area in which a G color filter pattern is provided among pixels positioned at outermost peripheries corresponding to four corners of an active area of a display panel so that there are effects of being capable of implementing a narrow bezel and improving a recognition rate of the process key.

Consequently, the display panel can be accurately aligned with manufacturing equipment or other objects, such that a process defect is reduced and the process efficiency is enhanced. Further, the process key can be recognized from both upper and lower sides of the display panel so that there is an effect of being capable of improving the process.

Accordingly, the embodiments disclosed herein are not intended to limit but explain the technical concept of the present disclosure, and the scope of the present disclosure should not be limited by the above embodiments.

Therefore, the above-described embodiments should be understood to be exemplary and not limiting in every aspect.

It should be understood that the scope of the present disclosure should be interpreted by the following claims and all technical concepts within the equivalent scope thereof should be interpreted as being included in the scope of the present disclosure.

What is claimed is:

1. A display device comprising:
a first substrate having an active area displaying an image and a non-active area along an edge of the active area;
a second substrate facing the first substrate; and
a process key including a first key pattern disposed on the first substrate in a corner of the active area,
wherein the first key pattern is disposed on the first substrate, wherein the active area includes a plurality of pixel areas defined by a plurality of gate lines and a plurality of data lines crossing vertically and horizontally, wherein the plurality of pixel areas include a green pixel area, and wherein the process key overlaps with the green pixel area, and
wherein the process key is configured to be detectable at both upper and lower sides of the first substrate and the second substrate.

2. The display device of claim 1, further comprising thin film transistors for operating pixels in the active area to display an image,
wherein the process key is for aligning the first substrate or the display device during a manufacturing process.

3. The display device of claim 2, wherein the first substrate is attached to the second substrate with a liquid crystal layer between the first and second substrates.

4. The display device of claim 2, wherein the thin film transistors form part of light emitting diodes, and one side of the first substrate is encapsulated by the second substrate.

5. The display device of claim 1, wherein the active area of the first substrate further includes a red pixel area corresponding to a red color filter pattern and a blue pixel area corresponding to a blue color filter pattern, and wherein the green pixel area corresponds to a green color filter pattern.

6. The display device of claim 5, wherein the first substrate comprises:
a thin film transistor including a gate electrode, gate and data lines, a semiconductor layer, and source and drain electrodes, wherein the first key pattern is formed of a material the same as those of the gate electrode and the plurality of gate lines in the same layer.

7. The display device of claim 5, wherein the process key overlaps the green color filter pattern.

8. The display device of claim 5, wherein an actual pattern is positioned in the non-active area, and the process key is positioned in the green pixel area secondarily adjacent to the actual pattern.

9. The display device of claim 1, wherein the process key includes a second key pattern made of a material different from that of the first key pattern.

10. The display device of claim 9, wherein:
the first key pattern is made of at least one selected from among "+," "−," "L," "O," and "T" shapes; and
the second key pattern is formed in a shape the same as that of the first key pattern along an edge of the second key pattern, or is formed in a closed curve shape or a closed polygonal shape surrounding the first key pattern.

11. The display device of claim 9, wherein the first key pattern and the second key pattern form a single shape.

12. The display device of claim 9, wherein the second key pattern has a shape corresponding to only a portion of the edge of the first key pattern.

13. The display device of claim 9, wherein the second key pattern is formed in a shape the same as that of the first key pattern, or the second key pattern is formed in a shape different from that of the first key pattern and is placed within an interior of the first key pattern.

14. The display device of claim 9, further comprising a black matrix in the second substrate, wherein the second key pattern is formed of the same material in the same layer as the black matrix.

15. The display device of claim 9, further comprising a light blocking layer below thin film transistors in the first substrate, wherein the light blocking layer and the second key pattern are made of a same black pigment and formed in the same layer.

16. A display device comprising:
a first substrate having an active area displaying an image and a non-active area along an edge of the active area;
a second substrate facing the first substrate;
a process key including a first key pattern and a second key pattern, the first key pattern disposed on the first substrate in a corner of the active area; and
a light blocking layer disposed between the first substrate and at least a part of a thin film transistor,
wherein a material of the second key pattern is different from a material of the first key pattern,
wherein the light blocking layer and the second key pattern have a same black pigment and
wherein the process key is configured to be detectable at both upper and lower sides of the first substrate and the second substrate.

* * * * *